US008361815B2

(12) United States Patent
Minami

(10) Patent No.: US 8,361,815 B2
(45) Date of Patent: Jan. 29, 2013

(54) SUBSTRATE PROCESSING METHOD AND METHOD FOR MANUFACTURING LIQUID EJECTION HEAD

(75) Inventor: Seiko Minami, Warabi (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 13/117,367

(22) Filed: May 27, 2011

(65) Prior Publication Data

US 2011/0300648 A1 Dec. 8, 2011

(30) Foreign Application Priority Data

Jun. 2, 2010 (JP) ................................ 2010-126740

(51) Int. Cl.
*H01L 21/00* (2006.01)

(52) U.S. Cl. ........................................................ 438/21

(58) Field of Classification Search .................... 438/21, 438/7

See application file for complete search history.

(56) References Cited

U.S. PATENT DOCUMENTS

| | | | | |
|---|---|---|---|---|
| 6,534,247 | B2 | 3/2003 | Milligan et al. | |
| 7,143,846 | B2 * | 12/2006 | Jarvela et al. | 175/257 |
| 8,004,021 | B2 * | 8/2011 | Miller et al. | 257/226 |
| 2010/0102473 | A1 | 4/2010 | Watanabe et al. | |

* cited by examiner

*Primary Examiner* — Charles Garber
*Assistant Examiner* — Andre' C Stevenson
(74) *Attorney, Agent, or Firm* — Fitzpatrick, Cella, Harper & Scinto

(57) ABSTRACT

A substrate processing method including the steps of disposing a substrate having a recess in such a manner that the face having the recess is upward in the gravity direction, and applying a resist to the recess and face having the recess to form a resist film thereon, and disposing the substrate having the resist film formed thereon in such a manner that the face having the recess is downward in the gravity direction, and applying a liquid capable of dissolving the resist to the resist film to adjust the thickness of the resist film. A method for manufacturing a liquid ejection head is also provided.

11 Claims, 3 Drawing Sheets

SUBSTRATE PROCESSING METHOD AND METHOD FOR MANUFACTURING LIQUID EJECTION HEAD

BACKGROUND OF THE INVENTION

1. Field of the Invention

The present invention relates to a substrate processing method and a method for manufacturing a liquid ejection head such as an ink jet recording head.

2. Description of the Related Art

A conventional method for manufacturing an ink jet recording head has the following steps as is disclosed in U.S. Pat. No. 6,534,247: a step of forming a layer having an ink-ejecting energy generating element on the upper portion of a silicon substrate and then digging a part of the above described layer so as to reach the above described substrate, a step of forming a nozzle part on the upper portion of the above described layer, a step of wet-etching the above described substrate to form a common ink-supply port, a step of applying a resist in the common ink-supply port, a step of patterning the bottom face portion of the common ink-supply port, and a step of forming an independent supply port by dry-etching the above described substrate so that the independent supply port communicates with the dug part in the above described layer.

SUMMARY OF THE INVENTION

In the conventional substrate processing technology, when a resist film is formed on a substrate having a recess, there has been a case in which the following phenomenon occurs. Specifically, an edge portion which is a brim of the recess is a portion at which the face of a substrate having a recess and the side wall of the recess intersect with each other, and there has been a case in which it has been difficult for the edge portion to be covered with the resist, because the resist is affected by the surface tension. In FIG. 1A, the edge portion is shown by a corner portion (reference numeral 2*a* in FIG. 1A) formed by the face having the recess of the substrate (reference numeral 1 in FIG. 1A) and the side wall of the recess (reference numeral 2*b* in FIG. 1A).

In addition, in a method for manufacturing an ink jet recording head which contains a substrate that has a common ink-supply port as a recess, there has been a case in which the following phenomenon occurs. Specifically, in U.S. Pat. No. 6,534,247, the opening precision of an independent supply port has been determined by previously digging a part of the layer, but when a nozzle part is formed with a spin coating technique, a level difference may be formed in the previously dug part and the flatness of the nozzle part may be lowered. For this reason, when forming the common ink-supply port in the lower portion of the silicon substrate after having formed the nozzle part, sequentially applying a resist to the common ink-supply port, patterning the resist and then forming the independent supply port by using the resist as a mask with the dry-etching technique, the etching mask has been required to have a high precision. However, similarly to the case in the substrate having the recess, a conventional technology has had a problem that it is difficult for the edge portions of the common ink-supply port (reference numeral 20*a* in FIG. 2B) to be coated with the resist, because the resist to be used as the etching mask is affected by the surface tension. When the resist film is thin on the edge portions, the edge portions may be etched in the subsequent dry-etching step, and in this case, there has been a concern that the shape of the edge portions may become nonuniform and color mixing of inks may occur in a mounting process. When the densification progresses and color difference becomes narrower in future, it is concerned that the color mixing of the inks further occurs.

An object of the present invention is to provide a substrate processing method which enhances a patterning precision of a resist film and enables a substrate to be processed with high precision by enhancing the resist-coating properties of the edge portions of a substrate recess, as well as a method for manufacturing a liquid ejection head.

In the substrate processing method and the method for manufacturing the liquid ejection head according to the present invention, an applied film can be easily coated even to a substrate having a shape which is difficult to be coated with an applied film on a processed surface.

The liquid ejection head for ejecting a liquid, which is manufactured according to the present invention, can be used in recording with an ink as an ink jet recording head.

In order to solve the above described subjects, the present invention provides a substrate processing method including the steps of: (a1) disposing a substrate having a recess in such a manner that the face having the recess is upward in the direction of gravity, and applying a resist to the recess and to the face having the recess of the substrate to form a resist film thereon; and (a2) disposing the substrate having the resist film formed thereon, in such a manner that the face having the recess is downward in the direction of gravity, and applying a liquid capable of dissolving the resist, to the resist film to adjust the thickness of the resist film.

In addition, the present invention provides a method for manufacturing a liquid ejection head, including the steps of: (b1) forming a common ink-supply port which has a bottom face portion in a place between a front face and a back face of a silicon substrate, on the back face side of the silicon substrate which is provided on the front face side with a plurality of ink-ejecting pressure energy generating elements, which generate energy capable of ejecting a liquid, through a first etching process; (b2) applying a resist to the common ink-supply port and to a face of the substrate having the common ink-supply port to form a resist film thereon; (b3) applying a liquid capable of dissolving the resist to the resist film to adjust the thickness of the resist film; (b4) patterning the resist film on the bottom face portion of the common ink-supply port; and (b5) etching the bottom face portion so as to penetrate the silicon substrate through a second etching process with the use of the pattern of the resist film, wherein the step b2 includes disposing the substrate in such a manner that the face having the common ink-supply port is upward in the direction of gravity, and the step b3 includes disposing the substrate having the resist film formed thereon in such that the face having the common ink-supply port is downward in the direction of gravity.

According to the above constitution, there are provided a substrate processing method which enhances a patterning precision of a resist film and enables a substrate to be processed with high precision by enhancing the coatability of the resist on the edge portions of a recess of the substrate, and a method for manufacturing a liquid ejection head.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiments according to the present invention will be described below with reference to the drawings. In the following description, an ink jet recording head will be described as an application example of a liquid ejection head of the present invention, but the application range of the present invention is not limited thereto.

Figure 3:
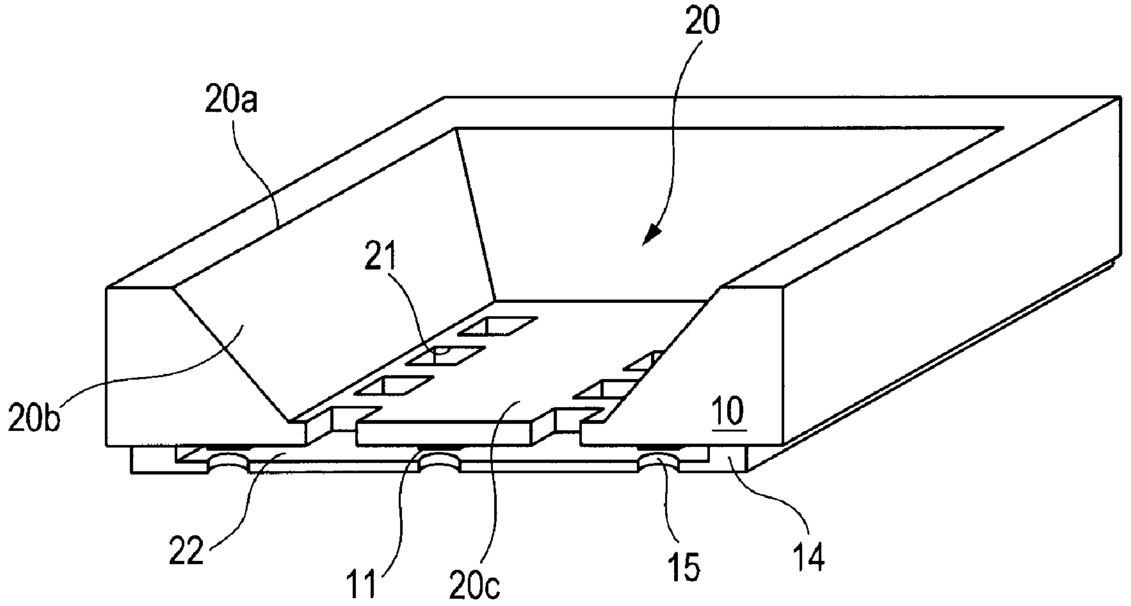
FIG. 3 is a schematic perspective view of the ink jet recording head shown in Embodiment 1.

First, the structure of an ink jet recording head manufactured with the method according to the present invention will be described. FIG. 3 is a schematic perspective view of an ink jet recording head manufactured with the method according to the present invention.

The ink jet recording head illustrated in FIG. 3 has a silicon substrate 10. On the front face side of the silicon substrate 10, a plurality of ink-ejecting energy generating elements 11, ink flow channels 22 and ejection ports 15 are provided. The silicon substrate 10 has a common ink-supply port 20 formed therein which penetrates the silicon substrate 10 and opens on the front and back faces of the substrate. Concerning the substrate 10, the face having a recess (common ink-supply port) of the substrate is referred to as a back face 101, and the face having the element 11 for generating ink-ejecting energy and the like provided thereon is termed a front face.

Next, the substrate processing method according to the present invention will be described with reference to FIGS. 1A to 1G.

A substrate usable for the present invention includes, for instance, a silicon single-crystal substrate, a glass substrate, a metal substrate and a resin substrate. The shape of the recess of the substrate can be appropriately selected as needed. The recess of the substrate can be formed, for instance, by the crystal anisotropic etching with an alkaline solution, and by a laser. The alkaline solution includes tetramethyl ammonium hydride (TMAH).

Figure 1A:
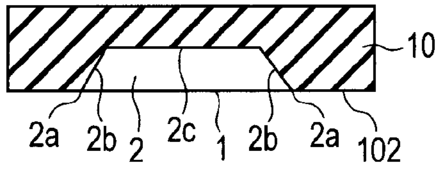
FIGS. 1A, 1B, 1C, 1D, 1E, 1F and 1G are schematic sectional views for describing, in time series, the steps of a substrate processing method according to the present invention.

A specific method for forming the recess in the substrate involves firstly forming a protective layer (not shown) which protects the substrate from an alkaline solution and a mask (not shown) for a first etching, on the silicon substrate 10, as is illustrated in FIG. 1A. The protective layer and the mask for a first etching are made from a material which has resistance to the alkaline solution. The silicon substrate 10 is subjected to a first etching by the crystal anisotropic etching with the use of the alkaline solution to form a recess 2 on one face of the substrate. After that, the mask for the first etching is removed, so that the substrate 10 is produced which has the recess 2 on the one face 102.

Figure 1B:
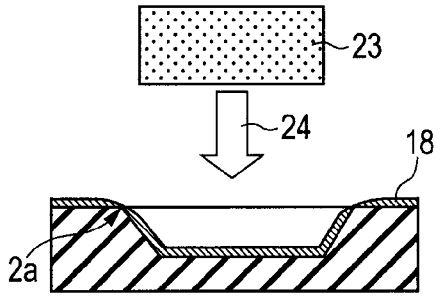

Next, the substrate having the recess is disposed, in such a manner that the face 1 having the recess is upward in the direction of gravity, and a resist is then applied to the recess and to the face having the recess of the substrate to form a resist film thereon (step a1). The substrate having the recess may be horizontal or may not be horizontal as long as the face 1 having the recess is on the upper side. For instance, as is illustrated in FIG. 1B, a spray nozzle 23 of a spray device is placed above the substrate 10 (upper side in the direction of gravity), and the substrate 10 is placed in such a manner that the recess of the substrate 10 is made upward, in other words, the surface having the recess is upward in the direction of gravity. Subsequently, a resist film 18 is formed on the substrate by making the spray nozzle 23 discharge a resist having photosensitivity vertically downward from above the substrate 10. The reference numeral 24 in FIG. 1B denotes the direction of discharging the resist. At this time, the resist is applied at least onto the recess 2 of the substrate and onto the face 1 having the recess, and the resist film 18 is formed. The phrase of applying the resist to the recess of the substrate and to the face having the recess means applying the resist at least to a part of the surface of the face having the recess formed thereon including the whole inner face (bottom face 2*c* and side walls 2*b* in FIG. 1A, which will be described later) of the recess (hollow portion). In the case of the substrate having the recess illustrated in FIG. 1A, the resist is applied onto the bottom face 2*c*, the side walls 2*b* and an edge portion 2*a* of the recess, and onto the surface of the substrate portion of the face 1 having the recess. In addition, the recess can be formed of the side walls and the bottom face portion, or can also be formed only of the side walls. The side walls of the recess are a face which is located between the bottom face portion and the face 102, and continues from the bottom face portion to the face 102. The side walls are denoted by the reference numeral 2*b* in FIG. 1A, for instance. The side walls may be a face perpendicular to the face having the recess, or may be a slope as is illustrated in FIG. 1A. The bottom face portion of the recess is denoted by the reference numeral 2*c* in FIG. 1A, for instance. As is illustrated in FIG. 1A, the bottom face portion 2*c* may be a face parallel to the face 1 having the recess, or may be a slope. As described above, the edge portion is a brim of the recess and is a portion at which the face having the recess of the substrate and the side walls of the recess intersect with each other. In FIG. 1A, the edge portion is shown by a corner portion (reference numeral 2*a*) which is formed by the face 1 having the recess of the substrate and the side wall 2*b* of the recess.

For example, AZP4620 (trade name, made by AZ Electronic Materials), OFPR (trade name, made by TOKYO OHKA KOGYO CO., LTD.) and BCB (trade name, made by Dow Corning Corporation) may be mentioned as a photosensitive resist suitable for the spray coating technique. At this time, the film thickness of the resist film generally becomes thinnest at the edge portion 2*a* of the substrate in the whole of the substrate, because the resist is coated to the edge portion with difficulty as it is affected by the surface tension.

In this case, if the face having the recess is upward in the direction of gravity when the resist is applied to the substrate, the direction of the substrate can also be adjusted as needed. In addition, when the resist is discharged from a discharging nozzle to the substrate, the direction of the nozzle can also be adjusted as needed.

In addition, examples of suitable methods for applying the resist to the substrate may include the spray coating technique and a mist coating technique. In addition, besides the above-mentioned photosensitive resist, for instance, a rubber-based resin having protective properties though having no photosensitivity and a resin having water repellency may be used.

Next, the substrate having the resist film formed thereon is disposed in such a manner that the face having the recess is made downward in the direction of gravity, a liquid (resist-dissolving liquid) which can dissolve the resist is applied to the resist film, and the thickness of the resist film is adjusted (step a2). The substrate having the recess may be horizontal or may not be horizontal as long as the face having the recess is made downward. In addition, the thickness of the resist film at each portion of the substrate having the recess can be selected according to the subsequent step. For instance, when the resist film is patterned and the substrate is etched while using the resist film as a mask in the subsequent step, the thickness of the resist film on the edge portion can be adjusted to such a thickness that the edge portion is not etched. In the step a2, it is possible to make the resist-dissolving liquid dissolve the resist film on the area of the substrate having a larger thickness of resist film, and to make the dissolved resist migrate to the area having a smaller thickness of resist film, such as the edge portion, by making use of the gravity, and as a result, the coatability of the area having a smaller film thickness can be enhanced. In disposing the substrate having the resist film formed thereon in such a manner that the face having the recess is downward in the direction of gravity and then applying the resist-dissolving liquid thereto, the dissolved resist can be prevented from being solidified without migrating to the desired position. In addition, it can be selected as needed which portion of the resist film on the substrate is dissolved and to which portion the dissolved resist is migrated. However, as described above, since the resist film tends to be thin on the edge portion due to the affection by the surface tension, it is preferable to make the dissolved resist migrate to the edge portion. More specifically, when the substrate is disposed in such a manner that the face having the recess is upward in the direction of gravity and the resist is then applied to the face, the film migrates from the portion 2*a* to the portion 2*b* due to the surface tension, and accordingly the film on the portion 2*a* tends to be thin and the film on the portion 2*b* tends to be thick. For this reason, it is preferable to apply the resist-dissolving liquid to the resist film of the side walls (slope portions) 2*b* in the recess and make the dissolved resist migrate to the edge portions, from the viewpoint of the film thickness uniformity in the whole area of the recess. The possible thickness of the resist film on each portion of the substrate is as follows. Specifically, it is preferable that the thicknesses of resist films in the portions 2*a*, 2*b* and 2*c* are equal to the thickness of the resist film on the substrate portion of the face 1.

In addition, the direction of the substrate can be adjusted as needed, if the substrate is disposed in such a manner that the face having the recess is downward in the gravity direction when the resist-dissolving liquid is applied to the substrate. In addition, it is preferable to adjust the direction of the substrate so that the resist-dissolving liquid is discharged from the direction perpendicular to the side walls of the recess when making the resist-dissolving liquid discharged from the discharging nozzle and applying the resist-dissolving liquid to the resist film on the side walls of the recess. More specifically, it is preferable to draw a perpendicular line to the portion of the side walls to which the resist-dissolving liquid is applied, and adjust the direction of the substrate so that the resist-dissolving liquid is discharged to the portion from a position on the perpendicular line.

In addition, it is possible to adjust the direction of the nozzle as needed when applying the resist-dissolving liquid to the resist film by using the discharging nozzle which discharges the liquid, such as the spray nozzle 23. When applying this liquid to the resist film on the side wall of the recess, it is preferable to adjust the direction of the nozzle so that the direction (reference numeral 25 in FIGS. 1A to 1G) of discharging the resist-dissolving liquid from the nozzle and the side wall of the recess become perpendicular to each other, from the view point of the control of the amount of the film to be dissolved. More specifically, it is preferable to draw a perpendicular line to the portion of the side wall to which the resist-dissolving liquid is applied, and adjust the direction of the nozzle so that the liquid is discharged to the portion from a position on the perpendicular line.

The resist-dissolving liquid can be selected according to the resist used, and acetone or propylene glycol monomethyl ether acetate (PGMEA), for instance, can be used. In addition, the resist-dissolving liquid can be a solvent containing a resist component.

When the resist-dissolving liquid is discharged from the discharging nozzle which discharges the liquid to be applied to the resist film, the timing for discharge can be appropriately determined. The liquid can be discharged by a pulse control and can be continuously discharged, for instance. Among these methods, it is preferable to control the discharge timing of the resist-dissolving liquid by the pulse control, from the view point of the control of the amount of the film to be dissolved. In addition, examples of a method of applying the resist-dissolving liquid may include methods similar to the above described methods of applying the resist. In addition, it is preferable to apply the resist to the substrate having the recess and apply the resist-dissolving liquid to the resist film, with the spray coating technique, from the view point of the controllability of the application amount. The spray coating technique is an example of the methods of discharging the above described liquid from the discharging nozzle.

Figure 1C:
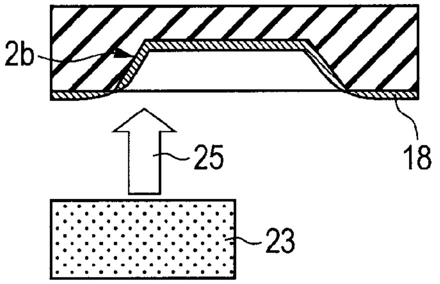

As for a specific example of the step a2, as is illustrated in FIG. 1C, a substrate 10 is placed above (on the upper side in the gravity direction) the spray nozzle 23 of the above described spray device, and the substrate 10 is disposed in such a manner that the recess of the substrate 10 is made downward, in other words, the face having the recess is downward in the gravity direction. Subsequently, the resist-dissolving liquid is applied vertically upward to the slope portions 2*b* of the substrate from below the substrate 10 (lower side in the gravity direction).

Figure 1D:
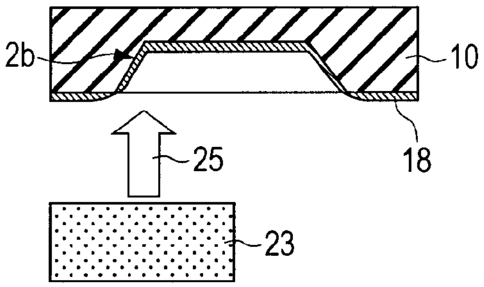
Figure 1E:
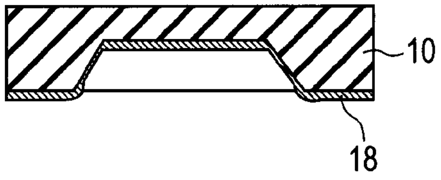

Then, as illustrated in FIG. 1D, the resist film in the portion (slope portions 2*b* of substrate) to which the resist-dissolving liquid has been applied is dissolved by the resist-dissolving liquid and sags and then runs down and stays in the edge portion 2*a* of the substrate. Thereby, ultimately, it is possible to enhance the coatability of the edge portion 2*a* of the substrate, onto which the applied film is coated with difficulty, as illustrated in FIG. 1E.

Figure 1F:
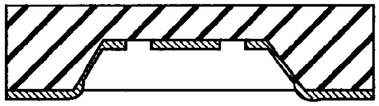

In addition, the substrate processing method according to the present invention can include patterning the resist film formed on the bottom face of the recess, after the completion of the step a2. Specifically, the formed resist film 18 in the above description is exposed to light and is developed to form a resist pattern, as illustrated in FIG. 1F, for instance. Because of the enhanced coatability of the portion in the recess of the substrate, to which portion the applied film is coated with difficulty, it becomes unnecessary to increase the film thickness on the whole area of the recess of the substrate, a patterning precision can be enhanced, and the substrate can be processed with high precision.

Figure 1G:
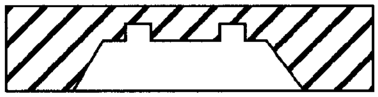

Next, as a second etching, the patterning of the resist film can be employed to form a finer recess area, uneven area and through hole on the substrate. Specifically, finer recesses may be formed on the bottom face portion 2*c* by using the above-mentioned resist pattern as a mask according to a dry etching method, as is illustrated in FIG. 1G. Finally, the resist pattern and the protective layer (not shown) are removed.

Thereby, finer recesses having a size within the supposed dimension can be formed on the bottom face portion of the substrate, without giving any damage due to dry etching to the edge of the substrate.

The above described substrate processing method for the substrate having a recess can be applied to a method for manufacturing a liquid ejection head which has a substrate having a common ink-supply port as a recess. At this time, a desirable form of a method for applying the resist is similar to the case of the above described substrate processing method. Incidentally, the depth (distance from back face 101 of substrate to bottom face portion 20*c* in FIG. 2B) of the common ink-supply port which is a recess can be determined as needed. The method for manufacturing the liquid ejection head according to the present invention involves the following steps of (b1) forming a common ink-supply port which has a bottom face portion in a place between a front face and a back face of a silicon substrate, on the back face side of the silicon substrate which is provided on the front face side with a plurality of ink-ejecting pressure energy generating elements, which generate energy capable of ejecting a liquid, through a first etching process, (b2) applying a resist to the common ink-supply port and to a face of the substrate having the common ink-supply port to form a resist film thereon, (b3) applying a liquid capable of dissolving the resist to the resist film to adjust the thickness of the resist film, (b4) patterning the resist film on the bottom face portion of the common ink-supply port, and (b5) etching the bottom face portion so as to penetrate the silicon substrate through a second etching process with the use of the patterning of the resist film.

In addition, similarly to the case of the substrate processing method, the step b2 includes disposing the substrate in such a manner that the face having the common ink-supply port is upward in the gravity direction, and the step b3 includes disposing the substrate having the resist film formed thereon in such a manner that the face having the common ink-supply port is downward in the gravity direction.

In the substrate processing method and the method for manufacturing the liquid ejection head according to the present invention, the resist coating properties of the edge portion of the substrate is enhanced, and accordingly the following can be said. Specifically, the thickness of the resist film on the whole area of substrate, particularly the thickness of the resist film on the bottom face of the recess, and as for the liquid ejection head, the thickness of the resist film on the bottom face (patterned face) of the common ink-supply port, do not become larger than needed thickness, and the patterning precision is enhanced. Because of this, the substrate can be processed with high precision.

[Embodiment]

An ink jet recording head was manufactured by using the manufacturing method according to the present invention. The procedure will be described in detail with reference to FIGS. 2A to 2I.

Figure 2A:
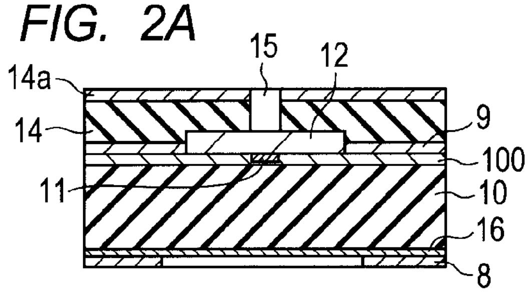
FIGS. 2A, 2B, 2C, 2D, 2E, 2F, 2G, 2H and 2I are schematic sectional views for describing, in time series, the steps of manufacturing an ink jet recording head shown in Embodiment 1.

Firstly, a silicon single-crystal substrate 10 as illustrated in FIG. 2A was provided (step b1). Specifically, the substrate 10 had an ink-ejecting energy generating element 11, an adhesion-enhancing layer 9, a positive type resist layer 12, an ink flow channel structure material layer 14, a water-repellent film 14*a* and an ejection port 15 provided on the front face, and had a mask 8 for the first etching and a thermally-oxidized film 16 provided on the back face.

Figure 2B:
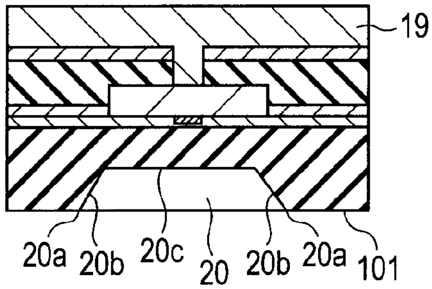

Next, as illustrated in FIG. 2B, a protective layer 19 was formed on the ink flow channel structure material layer 14, which had the water-repellent film 14*a* on the surface, and in the ejection port 15 so as to protect the material layer from an alkaline solution. The protective layer 19 was formed using a material which was placed on the market with a brand name OBC by TOKYO OHKA KOGYO CO., Ltd. After that, the silicon substrate 10 was immersed in a 22 mass % solution of tetramethyl ammonium hydride (TMAH) at 83° C. for 12 hours, as the first etching, and a common ink-supply port 20 for supplying an ink was formed as a recess of the substrate. The common ink-supply port 20 has a side wall 20*b* of the common ink-supply port and a bottom face portion 20*c* of the common ink-supply port, and a corner portion which is formed by the face having the common ink-supply port of the substrate and the side wall 20*b* is called an edge portion 20*a*. The side walls 20*b* were located between the bottom face 20*c* and a back face 101 of the substrate 10, and the distance from the back face 101 to the flat face of the bottom face portion 20*c* of the common ink-supply port 20 was 500 μm. The used silicon substrate 10 was a CZ substrate (trade name, made by Mitsubishi Materials Corporation) with a thickness of 625±15 μm and a size of 6 inch (Φ (diameter) of 150 mm). Furthermore, the mask 8 for the first etching and the thermally-oxidized film 16 which were formed on the back face of the substrate were removed.

Figure 2C:
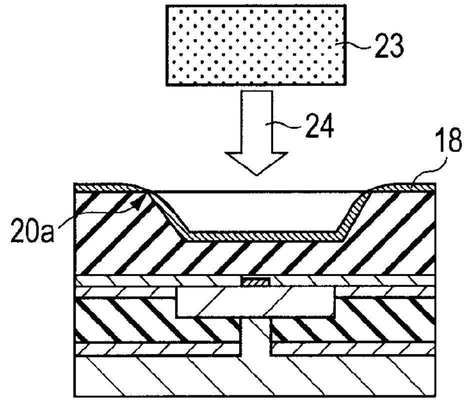

Next, the substrate 10 was disposed in such a manner that the face having the common ink-supply port was upward (on the upper side) in the gravity direction, and a resist was applied to the common ink-supply port of the substrate and face having the common ink-supply port, and a resist film 18 was formed (step b2). Specifically, as illustrated in FIG. 2C, a spray nozzle 23 of a spray device was placed above the substrate 10 (on the upper side in the gravity direction), and the substrate 10 was disposed in such a manner that the common ink-supply port 20 of the substrate was upward, in other words, the face having the common ink-supply port was upward (on the upper side) in the gravity direction. Subsequently, a resist having photosensitivity, which was AZP4620 (trade name, made by AZ Electronic Materials), was applied vertically downward from above the substrate 10. At this time, the film thickness of the resist film became largest on the edge portion 20*a* of the common ink-supply port in the whole area of the substrate, because it was difficult to coat the edge portion with the resist because the resist was affected by the surface tension.

Figure 2D:
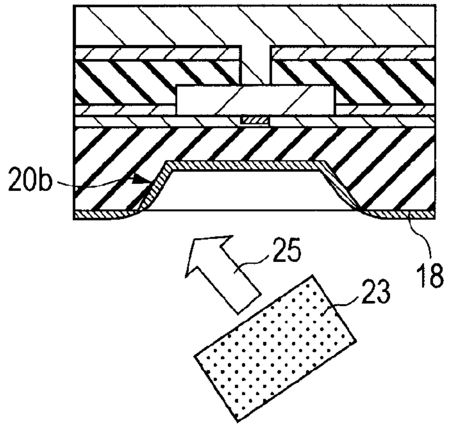

Next, the substrate having the resist film 18 formed thereon was disposed in such a manner that the face having the common ink-supply port was downward in the gravity direction, a liquid capable of dissolving the resist was applied to the resist film, and the thickness of the resist film was adjusted (step b3). Specifically, as illustrated in FIG. 2D, the substrate 10 was placed above the spray nozzle 23 of the above described spray device (on the upper side in the gravity direction), and the substrate 10 was disposed in such a manner that the opening of the common ink-supply port of the substrate was downward, in other words, the face having the ink-supply port was downward (on the lower side) in the gravity direction. Subsequently, the spray nozzle 23 was set in the state of having been inclined with respect to the vertical direction, and the liquid capable of dissolving the resist was discharged from the spray nozzle 23 and was applied to the resist film on the slope portions 20*b* of the common ink-supply port. At this time, the spray nozzle 23 was adjusted so that the direction 25 of discharging the liquid was perpendicular to the slope portion 20*b* of the common ink-supply port, and the timing of discharging the liquid was subjected to a pulse control.

Figure 2E:
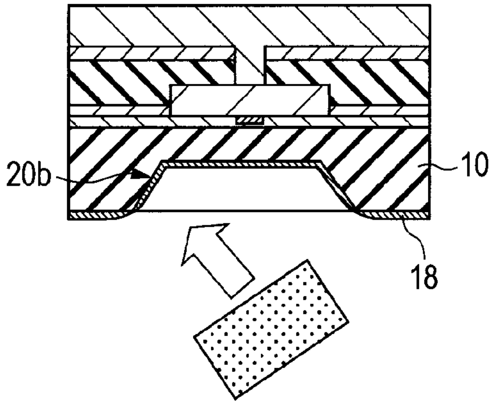
Figure 2F:
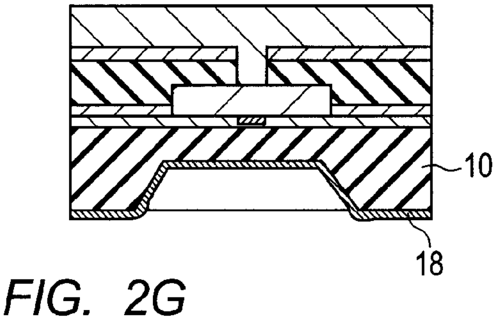

Then, as illustrated in FIG. 2E, the resist film on the slope portions 20*b* of the common ink-supply port was dissolved by the resist-dissolving liquid, sagged and then ran down and stayed in the edge portion 20*a* of the common ink-supply port. Finally, as illustrated in FIG. 2F, the resist coatability of the edge portion 20*a* of the common ink-supply port was enhanced, which edge portion was difficult to be coated with the applied film.

Figure 2G:
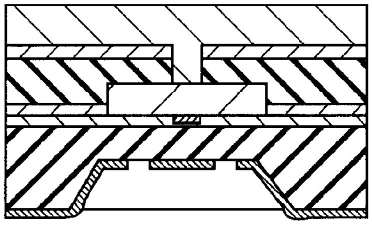

Subsequently to step b3, the resist film on the bottom face portion of the common ink-supply port was patterned (step b4). Specifically, the resist film 18 was exposed to light and was developed to form a pattern of independent supply ports, as illustrated in FIG. 2G. Because the coatability on the edge portion 20*a* of the common ink-supply port was enhanced, which edge portion was difficult to be coated with the applied film, it became unnecessary to increase the film thickness on the whole substrate, the patterning precision was enhanced, and the substrate was enabled to be processed with high precision.

Figure 2H:
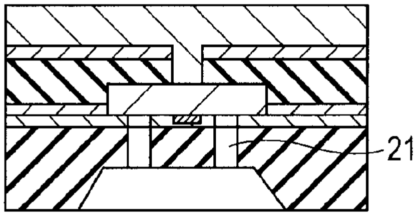

Next, the bottom face portion was etched as the second etching until the etching penetrated the silicon substrate by using the pattern of the above described resist film (step b5). Specifically, as illustrated in FIG. 2H, independent supply ports 21 were formed by using the formed resist pattern as a mask with a dry etching method. At this time, since the edge portion 20*a* of the common ink-supply port had a good coatability, only a desired portion could be etched, and there disappeared a concern about the color mixing of inks in a mounting step due to etching. After that, the resist film 18 was removed, and the rest of the silicon portion of the silicon substrate 10 was removed with the use of a resist mask to expose part of a P—SiO film 100 which was a membrane film. Subsequently, the thus exposed part was removed, and the common ink-supply port was caused to penetrate to the front face side of the substrate.

Figure 2I:
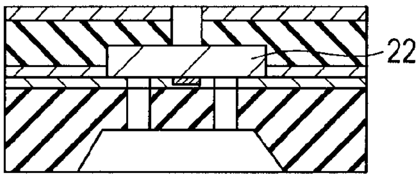

Finally, the above described silicon substrate 10 was immersed in xylene, and the protective layer 19 and the positive type resist layer 12 which was a mold material for the ink flow channel were removed as illustrated in FIG. 2I. According to the process step, an ink liquid flow channel 22 was formed which communicated with the ejection port 15 and was symmetrical with respect to the ink ejection energy generating element 11, as illustrated in the sectional view of FIG. 2I. After that, the resultant was fully cured.

In the above method, a liquid ejection head could be manufactured, in which the independent supply ports had a magnitude controlled within assumed dimensions, without giving any damage to the edge portion of the substrate despite the dry etching.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-126740, filed Jun. 2, 2010, which is hereby incorporated by reference herein in its entirety.

What is claimed is:

1. A substrate processing method comprising the steps of:

(1) disposing a substrate having a face having a recess in such a manner that the face having the recess faces upward in the direction of gravity, and applying a resist to the recess and to the face having the recess of the substrate to form a resist film thereon; and (2) disposing the substrate having the resist film formed thereon in such a manner that the face having the recess faces downward in the direction of gravity, and applying a liquid capable of dissolving the resist to the resist film to adjust the thickness of the resist film.

2. The substrate processing method according to claim 1, wherein the recess has side walls and the step (2) further comprises applying the liquid to the resist film formed on the side walls of the recess.

3. The substrate processing method according to claim 2, wherein the step (2) comprises applying the liquid to the resist film formed on the side walls of the recess by using a discharging nozzle for discharging the liquid, and when applying the liquid to the resist film formed on one of the side walls, the direction of discharging the liquid from the nozzle and the one side wall of the recess are controlled to be perpendicular to each other.

4. The substrate processing method according to claim 1, wherein the recess has side walls and a bottom face portion, and the method further comprises patterning the resist film formed on the bottom face portion of the recess, after the completion of the step (2).

5. The substrate processing method according to claim 1, wherein the liquid is a solvent containing a resist component.

6. The substrate processing method according to claim 1, wherein the substrate having the recess is a silicon single-crystal substrate, and the recess is formed by a crystal anisotropic etching with the use of an alkaline solution.

7. A method for manufacturing a liquid ejection head, comprising the steps of:

(1) forming, through a first etching process, a common ink-supply port which has a bottom face portion in a place between a front face and a back face of a silicon substrate, on the back face of the silicon substrate, the silicon substrate being provided on the front face with a plurality of ink-ejecting pressure energy generating elements, which generate energy capable of ejecting a liquid;

(2) applying a resist to the common ink-supply port and to a face of the substrate having the common ink-supply port to form a resist film thereon;

(3) applying a liquid capable of dissolving the resist to the resist film to adjust the thickness of the resist film;

(4) patterning the resist film on the bottom face portion of the common ink-supply port; and (5) etching the bottom face portion so as to penetrate the silicon substrate through a second etching process with the use of the patterning of the resist film, wherein the step (2) comprises disposing the substrate in such a manner that the face having the common ink-supply port faces upward in the direction of gravity, and the step (3) comprises disposing the substrate having the resist film formed thereon in such a manner that the face having the common ink-supply port faces downward in the direction of gravity.

8. The method for manufacturing the liquid ejection head according to claim 7, wherein the common ink-supply port has side walls and the step (3) further comprises applying the liquid to the resist film formed on the side walls of the common ink-supply port.

9. The method for manufacturing the liquid ejection head according to claim 8, wherein the step 3 comprises applying the liquid to the resist film formed on the side walls of the common ink-supply port by using a discharging nozzle for discharging the liquid, and when applying the liquid to the resist film formed on one of the side walls, the direction of discharging the liquid from the nozzle and the side wall of the common ink-supply port are controlled to be perpendicular to each other.

10. The method for manufacturing the liquid ejection head according to claim 7, wherein the liquid capable of dissolving the resist is a solvent containing a resist component.

11. The method for manufacturing the liquid ejection head according to claim 7, wherein the substrate is a silicon single-crystal substrate, and the common ink-supply port is formed by a crystal anisotropic etching with the use of an alkaline solution.

* * * * *